(12) United States Patent
Kaneda et al.

(10) Patent No.: US 7,966,720 B2
(45) Date of Patent: Jun. 28, 2011

(54) METHOD OF MANUFACTURING AN ELEMENT SUBSTRATE

(75) Inventors: Toshihiko Kaneda, Hakusan (JP); Satoshi Kimura, Fujimi (JP); Hidemichi Furihata, Chino (JP); Takeshi Kijima, Matsumoto (JP)

(73) Assignee: Seiko Epson Corporation (JP)

( * ) Notice: Subject to any disclaimer, the term of this patent is extended or adjusted under 35 U.S.C. 154(b) by 901 days.

(21) Appl. No.: 11/906,550

(22) Filed: Oct. 2, 2007

(65) Prior Publication Data

US 2008/0261026 A1 Oct. 23, 2008

(30) Foreign Application Priority Data

Oct. 3, 2006 (JP) ................. 2006-271808

(51) Int. Cl.
*H05K 3/30* (2006.01)

(52) U.S. Cl. ................ 29/832; 29/830; 29/831; 29/846; 29/847; 29/852

(58) Field of Classification Search .............. 29/830, 29/831, 832, 852, 846, 847; 216/12, 48, 216/54; 428/332, 201, 172, 385; 427/226, 427/387, 388.1, 388.5, 388.2, 397.7, 398.8
See application file for complete search history.

(56) References Cited

U.S. PATENT DOCUMENTS

| | | | |
|---|---|---|---|
| 4,555,285 A | 11/1985 | Chance et al. | |
| 6,113,836 A * | 9/2000 | Sakai et al. | 264/400 |
| 6,767,828 B2 | 7/2004 | Andry et al. | |
| 6,798,032 B2 * | 9/2004 | Izumi et al. | 257/443 |
| 2001/0023779 A1 * | 9/2001 | Sugaya et al. | 174/255 |
| 2004/0266173 A1 | 12/2004 | Andry et al. | |
| 2005/0276934 A1 | 12/2005 | Fukui et al. | |
| 2006/0071323 A1 | 4/2006 | Martin et al. | |
| 2006/0081557 A1 * | 4/2006 | Xu et al. | 216/48 |
| 2006/0148209 A1 | 7/2006 | Maruyama et al. | |

FOREIGN PATENT DOCUMENTS

| | | |
|---|---|---|
| CN | 1781350 | 5/2006 |
| JP | 60-128695 | 7/1985 |
| JP | 62-199482 | 9/1987 |
| JP | 06-053632 | 2/1994 |
| JP | 10-065315 | 3/1998 |
| JP | 2001-111211 | 4/2001 |
| JP | 2002-368386 | 12/2002 |
| JP | 2003-092461 | 3/2003 |
| JP | 2003-218498 | 7/2003 |
| JP | 2004-193594 | 7/2004 |
| JP | 2004-288802 | 10/2004 |
| JP | 2005-236006 | 9/2005 |
| JP | 2006-190748 | 7/2006 |
| JP | 2006-196792 | 7/2006 |

* cited by examiner

*Primary Examiner* — Derris H Banks
*Assistant Examiner* — Tai Nguyen
(74) *Attorney, Agent, or Firm* — Harness, Dickey & Pierce, P.L.C.

(57) ABSTRACT

A method of manufacturing an element substrate including: forming a release layer on a first support substrate; forming a metal layer having a predetermined pattern on the release layer; applying a sol-gel solution including a material for an inorganic substrate to the first support substrate; removing a solvent from the sol-gel solution by heat treatment to form the inorganic substrate; and removing the metal layer from the first support substrate by decomposing the release layer to transfer the metal layer to the inorganic substrate.

6 Claims, 9 Drawing Sheets

METHOD OF MANUFACTURING AN ELEMENT SUBSTRATE

Japanese Patent Application No. 2006-271808, filed on Oct. 3, 2006, is hereby incorporated by reference in its entirety.

BACKGROUND OF THE INVENTION

The present invention relates to an element substrate and a method of manufacturing the same.

Metal wires and the like are formed on a substrate using a subtractive method, for example. In the subtractive method, a metal layer is formed over the whole surface of a substrate, and a photoresist is applied to the metal layer and patterned. The metal layer is then etched using the photoresist as a mask. Such a method has a problem in which resources and materials are wasted due to removal of the photoresist and partial removal of the metal layer. Further, it is difficult to accurately form a metal layer with a submicrometer fine pattern.

SUMMARY

According to a first aspect of the invention, there is provided an element substrate comprising:
  an inorganic substrate having a hole in a top surface; and
  a metal layer embedded in the hole;
  the hole having a width of 40 nanometers to 1 micrometer and a depth of 20 nanometers to 300 nanometers.

According to a second aspect of the invention, there is provided a method of manufacturing an element substrate comprising:
  (a) forming a release layer on a first support substrate;
  (b) forming a metal layer having a predetermined pattern on the release layer;
  (c) applying a sol-gel solution including a material for an inorganic substrate to the first support substrate;
  (d) removing a solvent from the sol-gel solution by heat treatment to form the inorganic substrate; and
  (e) removing the metal layer from the first support substrate by decomposing the release layer to transfer the metal layer to the inorganic substrate.

DETAILED DESCRIPTION OF THE EMBODIMENT

Figure 1:
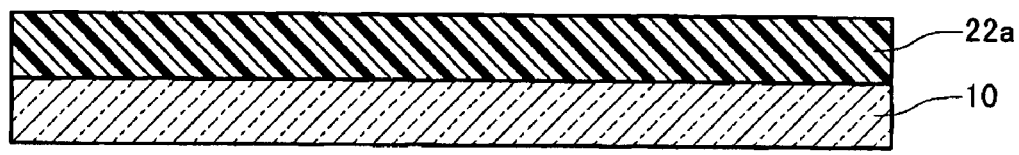
FIG. 1 is a diagram showing a method of manufacturing an element substrate according to one embodiment of the invention.
Figure 2:
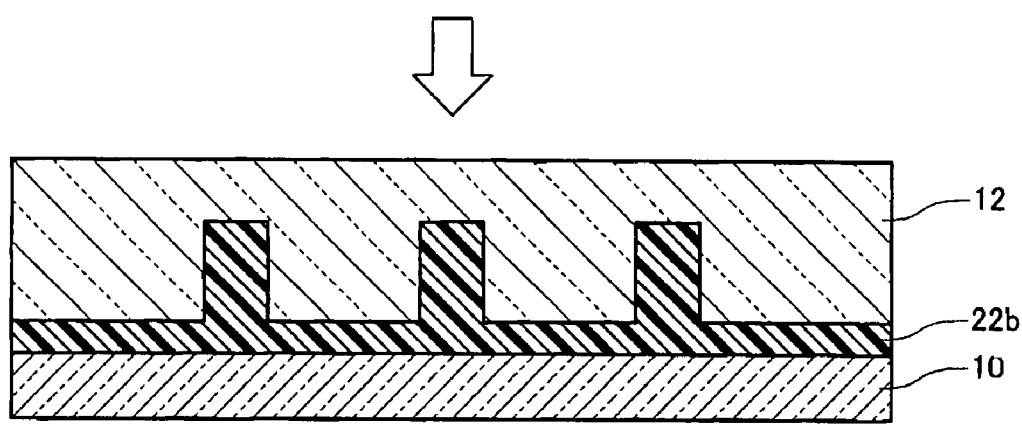
FIG. 2 is a diagram showing a method of manufacturing an element substrate according to one embodiment of the invention.

The invention may provide an element substrate in which a metal layer with a fine pattern is formed with high accuracy, and a method of manufacturing the same.

According to one embodiment of the invention, there is provided an element substrate comprising:
  an inorganic substrate having a hole in a top surface; and
  a metal layer embedded in the hole;
  the hole having a width of 40 nanometers to 1 micrometer and a depth of 20 nanometers to 300 nanometers.

In this invention, when a component B is formed on a specific component A, the component B may be directly formed on the component A, or another component may be interposed between the component B and the component A.

In this element substrate, a recess may be formed in a top surface of the metal layer.

The element substrate exhibits resistant to scratches by forming a recess. Moreover, since the surface area is increased as compared with the case where the top surface is flat, the heat sink effect can be increased.

In this element substrate, the inorganic substrate may be an optically-transparent substrate.

According to one embodiment of the invention, there is provided a method of manufacturing an element substrate comprising:
  (a) forming a release layer on a first support substrate;
  (b) forming a metal layer having a predetermined pattern on the release layer;
  (c) applying a sol-gel solution including a material for an inorganic substrate to the first support substrate;
  (d) removing a solvent from the sol-gel solution by heat treatment to form the inorganic substrate; and
  (e) removing the metal layer from the first support substrate by decomposing the release layer to transfer the metal layer to the inorganic substrate.

This method of manufacturing an element substrate may further comprise:

polishing a surface of the inorganic substrate to which the metal layer is transferred after the step (e).

In this method of manufacturing an element substrate, the metal layer may be formed by electroless plating in the step (b).

In this method of manufacturing an element substrate, the first support substrate may be immersed in a surfactant solution in the step (a) to form a surfactant layer as the release layer; and the step (b) may include:

forming a catalyst layer on the release layer by immersing the first support substrate in a catalyst solution; and depositing a metal layer on the catalyst layer by immersing the first support substrate in an electroless plating solution.

This method of manufacturing an element substrate may further comprise:

(g) forming a resin section having the same predetermined pattern as the metal layer has on the first support substrate before the step (a), wherein the release layer may be formed on the resin section in the step (a).

In this method of manufacturing an element substrate, the step (g) may include:

applying a resin material in a fluid state to the first support substrate;

pressing a nanostamper having a predetermined recessed pattern against the first support substrate to transfer the predetermined recessed pattern to the resin material; and curing the resin material.

In this method of manufacturing an element substrate, an upper portion of the cured resin material and a portion of the cured resin material not having the transferred predetermined pattern may be removed by ashing between the steps (g) and (a).

In this method of manufacturing an element substrate, the resin section may be formed of a photoresist; and the resin section may be formed by an interference exposure method in the step (g).

This method of manufacturing an element substrate may further comprise:

removing part of the resin section by immersing the first support substrate in an alkaline solution.

Some embodiments of the invention will be described below with reference to the drawings.

1. Element Substrate and Method of Manufacturing the Same

Figure 15:
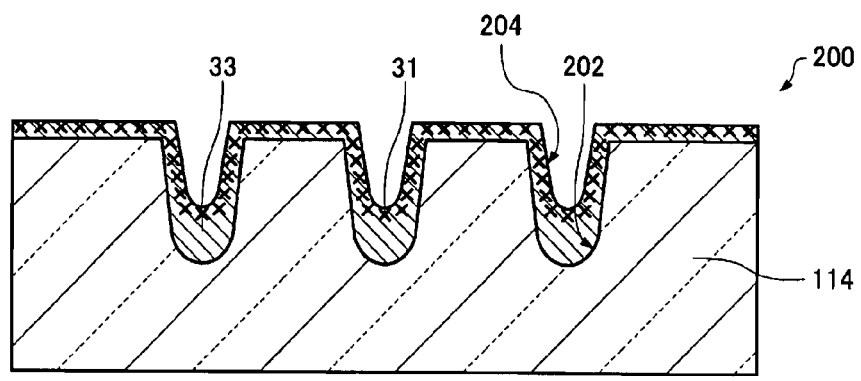
FIG. 15 is a diagram showing a method of manufacturing an element substrate according to one embodiment of the invention.
Figure 16:
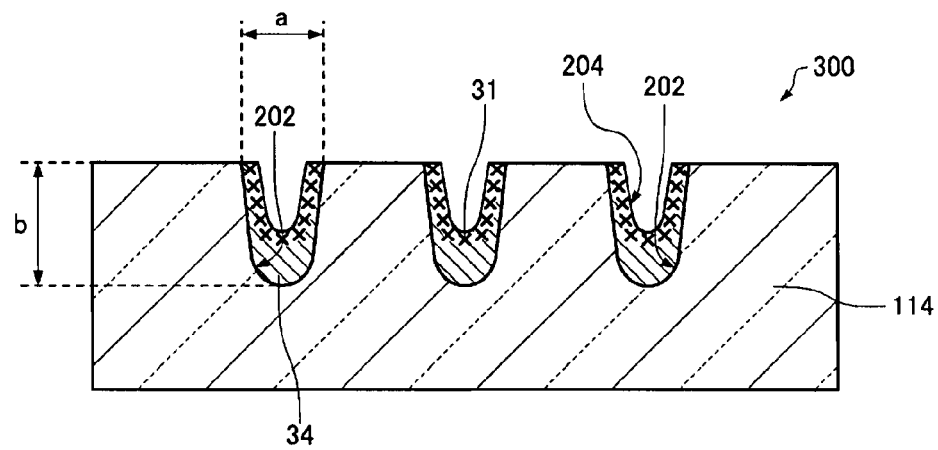
FIG. 16 is a cross-sectional diagram showing an element substrate according to one embodiment of the invention.

FIGS. 1 to 15 are diagrams showing a method of manufacturing a second element substrate 300 (see FIG. 16). In this embodiment, the element substrate is manufactured by electroless plating.

(1) A first support substrate 10 is provided. The first support substrate 10 preferably has a flat surface. The difference in height of the surface of the first support substrate 10 is desirably less than 10 nanometers, for example.

A resin section 22c having a predetermined pattern is formed on the first support substrate 10. As the method of forming the resin section 22c, a known method such as an interference exposure method or a nanoimprint technology may be used. In this embodiment, description will be given for the case where the resin section 22c is formed using the nanoimprint technology.

As shown in FIG. 1, a resin material 22a in a fluid state is applied to the first support substrate 10. A thermosetting resin, a thermoplastic resin, a photocurable resin, or the like may be used as the resin material 22a. As the application method, a known method such as a spin coating method may be used.

A nanostamper 12 is pressed in the direction of the first support substrate 10 (the arrow direction of FIG. 2) to transfer a predetermined pattern to the resin material. The predetermined pattern may be a periodic pattern having a number of lines arranged at uniform intervals. In the case where the resin material 22a is a photocurable resin, an optically transparent nanostamper 12 may be used.

Figure 3:
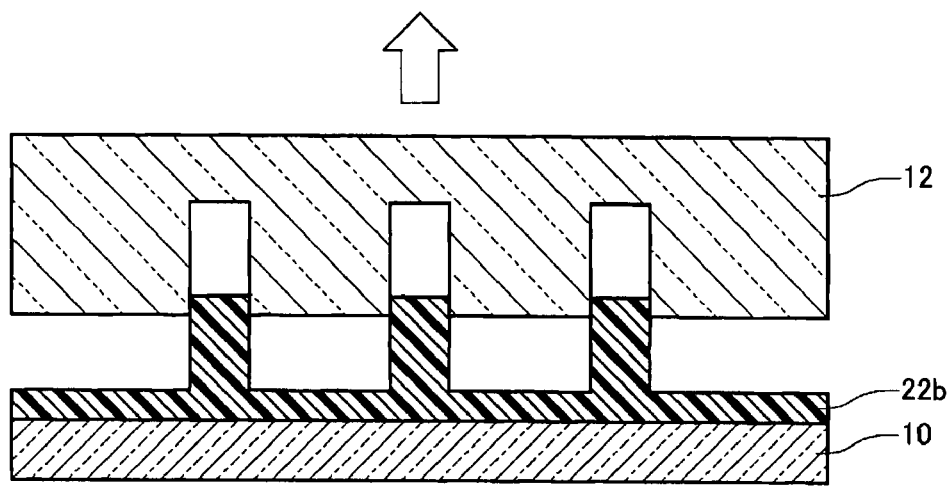
FIG. 3 is a diagram showing a method of manufacturing an element substrate according to one embodiment of the invention.
Figure 4:
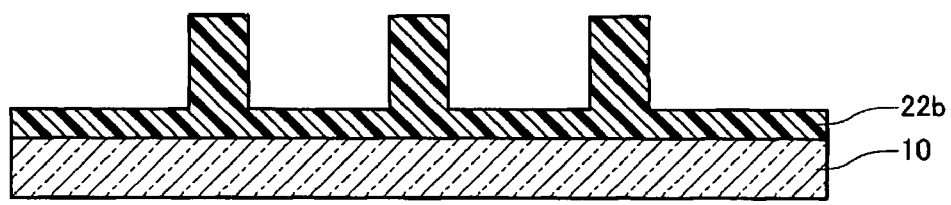
FIG. 4 is a diagram showing a method of manufacturing an element substrate according to one embodiment of the invention.
Figure 5:
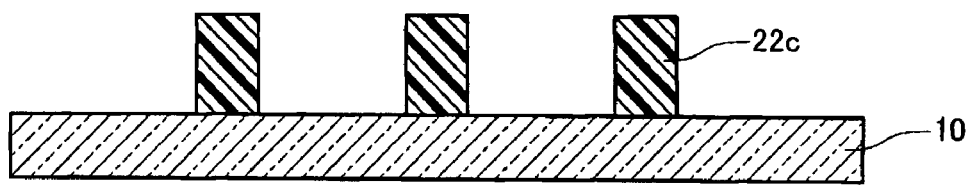
FIG. 5 is a diagram showing a method of manufacturing an element substrate according to one embodiment of the invention.

After curing a resin section 22b, the nanostamper 12 is removed from the resin section 22b (see FIG. 3). The resin section 22b having the predetermined pattern is thus formed, as shown in FIG. 4.

A step (2) described later may be performed using the resin section 22b, or the resin section 22b in the region other than the predetermined pattern may be partially removed by etching back or the like. In the case where the resin section 22b is a photoresist, the resin section 22b may be partially removed by ashing. In this case, the upper portion of the resin section 22b in the predetermined pattern is removed together with part of the resin section 22b provided in the region other than the predetermined pattern. The resin section 22c is formed by the above removing step.

The resin section 22c is formed using the nanoimprint technology in a manner described above. As already mentioned, the interference exposure method may be used for forming the resin section 22c. When the interference exposure method is used, it is preferable that the resin material 22a be a photoresist and an antireflective film be provided on the first support substrate 10.

(2) The surfaces of the first support substrate 10 and the resin section 22c are washed. The surfaces of the first support substrate 10 and the resin section 22c may be dry-washed or wet-washed. Of these, dry washing is preferable. Dry washing prevents the resin section 22c from being damaged (e.g. separated).

Figure 6:
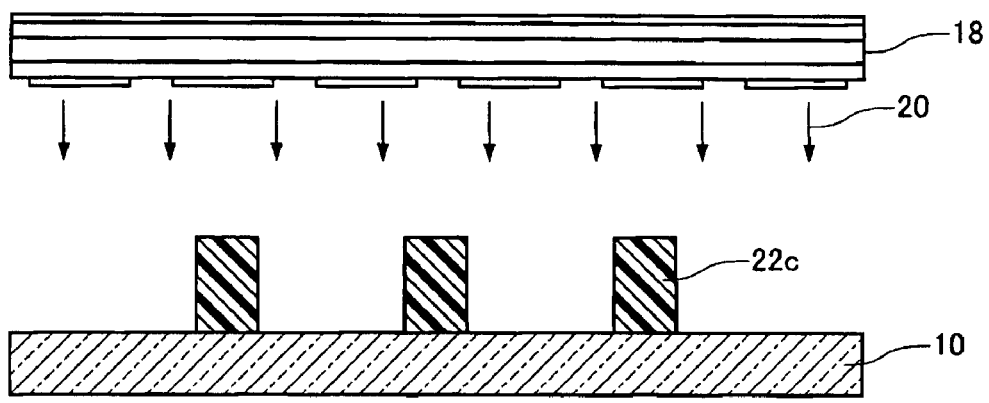
FIG. 6 is a diagram showing a method of manufacturing an element substrate according to one embodiment of the invention.

As shown in FIG. 6, dry washing may be performed by irradiating the first support substrate 10 and the resin section 22c with vacuum ultraviolet rays 20 for 30 to 900 seconds in a nitrogen atmosphere using a vacuum ultraviolet lamp 18 (wavelength: 172 nanometers, output: 10 milliwatts, distance from the sample: 1 millimeter). By washing the substrate 10, soil such as oils and fats adhering to the surface of the substrate 10 can be removed. In addition, the water-repellent surfaces of the first support substrate 10 and the resin section 22c can be made hydrophilic. When the surface potential in liquid of the first support substrate 10 is negative, a uniform negative potential surface can be formed by washing the first support substrate 10.

The surfaces of the first support substrate 10 and the resin section 22c may be wet-washed by immersing the first support substrate 10 in ozone water (ozone concentration: 10 ppm to 20 ppm) at room temperature for about 5 to 30 minutes, for example.

(3) A release layer 24 including a surfactant or a silane coupling agent is formed on the resin section 22c.

Figure 7:
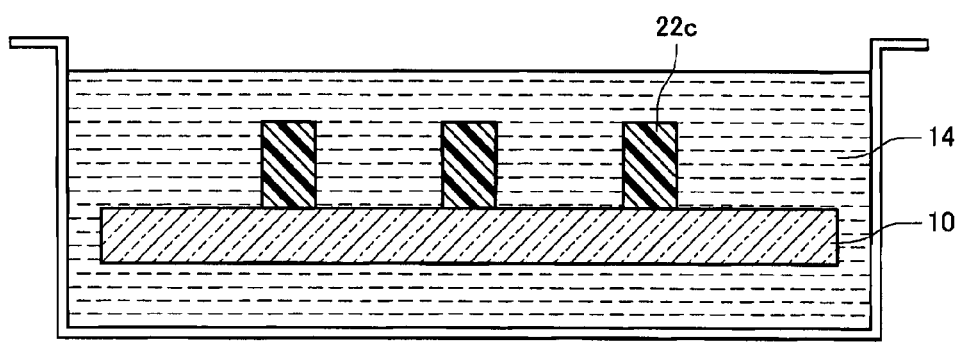
FIG. 7 is a diagram showing a method of manufacturing an element substrate according to one embodiment of the invention.

As shown in FIG. 7, the first support substrate 10 is immersed in a catalyst adsorption solution 14 in which a surfactant or a silane coupling agent is dissolved. When the surface potential in liquid of the first support substrate 10 is negative, it is preferable to use a cationic surfactant. This is because the cationic surfactant is easily adsorbed on the first support substrate 10 in comparison with other surfactants.

As the cationic surfactant, a water-soluble surfactant containing an aminosilane component, an alkylammonium surfactant (e.g. cetyltrimethylammonium chloride, cetyltrimethylammonium bromide, or cetyldimethylammonium bromide), or the like may be used. As the silane coupling agent included in the catalyst adsorption solution 14, hexamethyldisilazane may be used, for example. The immersion time may be about 1 to 15 minutes, for example.

The first support substrate 10 is removed from the catalyst adsorption solution 14 and washed with ultrapure water. After air-drying the first support substrate 10 at room temperature or removing water drops from the first support substrate 10 by spraying compressed air, the first support substrate 10 is dried in an oven at 90° C. to 120° C. for about 10 minutes to 1 hour. The release layer 24 (see FIG. 8) can be formed on the substrate 10 by the above steps. Diamond-like carbon may be used as the release layer 24. When the cationic surfactant is used, the surface potential in liquid of the first support substrate 10 is shifted toward the positive potential side in comparison with the surface potential before adsorption.

Figure 8:
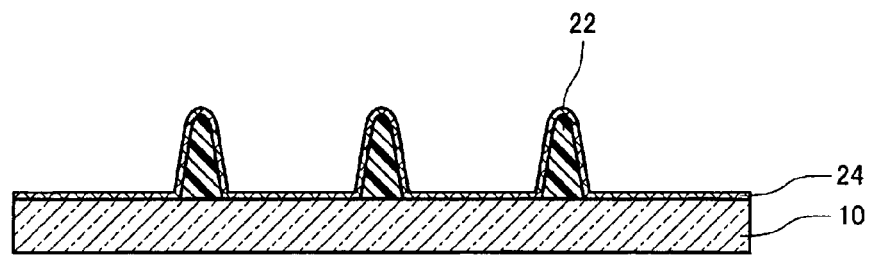
FIG. 8 is a diagram showing a method of manufacturing an element substrate according to one embodiment of the invention.

By immersing the first support substrate 10 in the catalyst adsorption solution 14, the resin section 22c is partially removed to form a shape shown in FIG. 8, for example. Specifically, the resin section 22c is partially removed in such a manner that the outer portion of the resin section 22c in contact with the catalyst adsorption solution 14 is removed (shaved). The resin section 22c is partially removed by dissolution when the catalyst adsorption solution 14 is an alkaline solution (specifically, pH 11 to pH 12). Thus, the size of the resin section 22c can be changed. The size of the resin section 22c can be controlled by adjusting the immersion time of the first support substrate 10 in the catalyst adsorption solution 14 or the pH of the catalyst adsorption solution 14.

Figure 9:
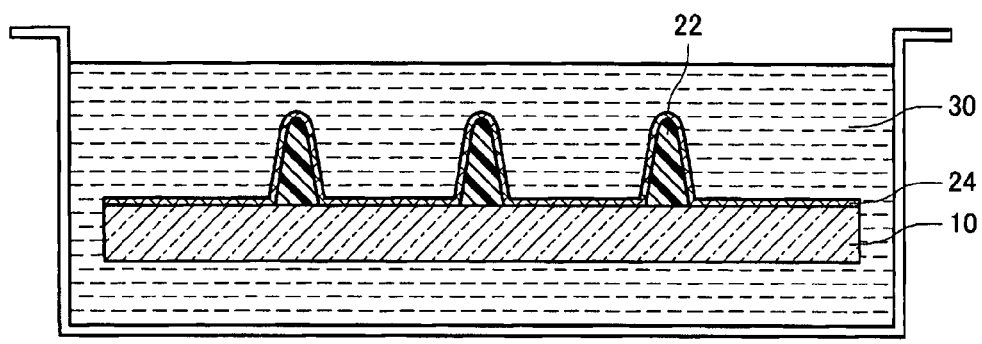
FIG. 9 is a diagram showing a method of manufacturing an element substrate according to one embodiment of the invention.

(4) A catalyst layer 31 is formed on the first support substrate 10. As shown in FIG. 9, the first support substrate 10 is immersed in a catalyst solution 30. The catalyst solution 30 includes a catalyst component which functions as a catalyst for electroless plating. For example, palladium may be used as the catalyst component.

The catalyst solution 30 may be prepared as follows, for example.

(4a) Palladium pellets with a purity of 99.99% are dissolved in a mixed solution of hydrochloric acid, a hydrogen peroxide solution, and water to prepare a palladium chloride solution with a palladium concentration of 0.1 to 0.5 g/l.

(4b) The palladium concentration of the palladium chloride solution is adjusted to 0.01 to 0.05 g/l by diluting the palladium chloride solution with water and a hydrogen peroxide solution.

(4c) The pH of the palladium chloride solution is adjusted to 4.5 to 6.8 using a sodium hydroxide aqueous solution or the like.

The first support substrate 10 may be washed with water after immersion in the catalyst solution 30. The first support substrate 10 may be washed with pure water. A catalyst residue can be prevented from being mixed into an electroless plating solution described later by washing the substrate 10 with water.

Figure 10:
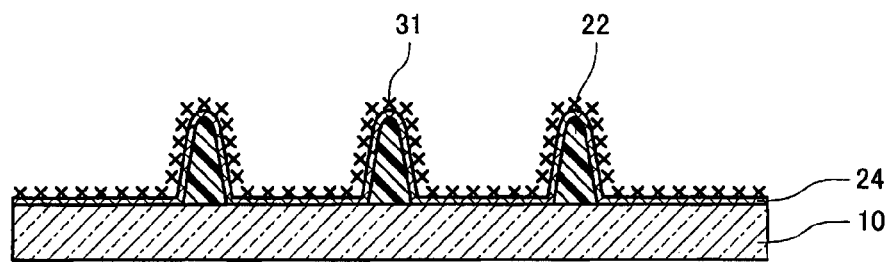
FIG. 10 is a diagram showing a method of manufacturing an element substrate according to one embodiment of the invention.

The catalyst layer 31 is formed by the above steps. As shown in FIG. 10, the catalyst layer 31 is formed on the top surface of the release layer 24 formed on the first support substrate 10 and the resin section 22.

Figure 11:
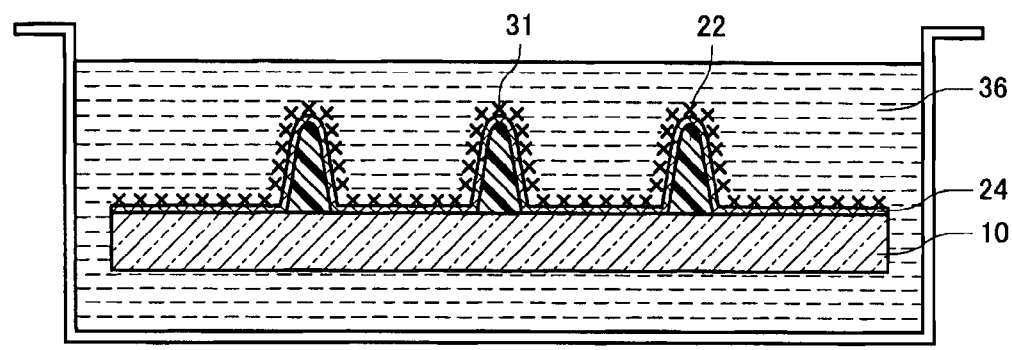
FIG. 11 is a diagram showing a method of manufacturing an element substrate according to one embodiment of the invention.

(5) A metal layer 33 is formed on the substrate. The metal layer 33 is formed in the region where the catalyst layer 31 is formed. In more detail, the metal layer 33 may be deposited by immersing the first support substrate 10 in an electroless plating solution 36 including a metal, as shown in FIG. 11. The electroless plating solution 36 is preferably prepared so that plating particles deposited on the first support substrate 10 have an average particle size of 20 nanometers to 50 nanometers. Such an electroless plating solution 36 may be prepared by changing the pH, temperature, preparation time, and the like. When the first support substrate 10 is immersed in the electroless plating solution 36 for a period of time equal to or longer than a predetermined period of time, the average particle size of the plating particles becomes greater than 50 nanometers. Thus, it is preferable that the immersion time be equal to or less than the predetermined period of time.

The metal may be nickel, for example. The electroless plating solution 36 is classified into an electroless plating solution used in an acidic region and an electroless plating solution used in an alkaline region. As an example of the electroless plating solution 36, an electroless plating solution used in an acidic region is applied. The electroless plating solution 36 includes the above metal, a reducing agent, a complexing agent, and the like. Specifically, the electroless plating solution 36 may be used which mainly includes nickel sulfate hexahydrate or nickel chloride hexahydrate and includes sodium hypophosphite as the reducing agent. For example, a nickel layer with a thickness of 20 nanometers to 100 nanometers may be formed by immersing the first support substrate 10 in an electroless plating solution (temperature: 70 to 80° C.) including nickel sulfate hexahydrate for about 10 seconds to 10 minutes.

Figure 12:
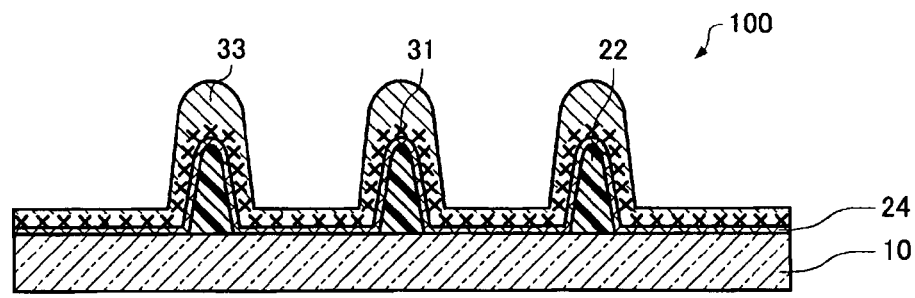
FIG. 12 is a diagram showing a method of manufacturing an element substrate according to one embodiment of the invention.
Figure 13:
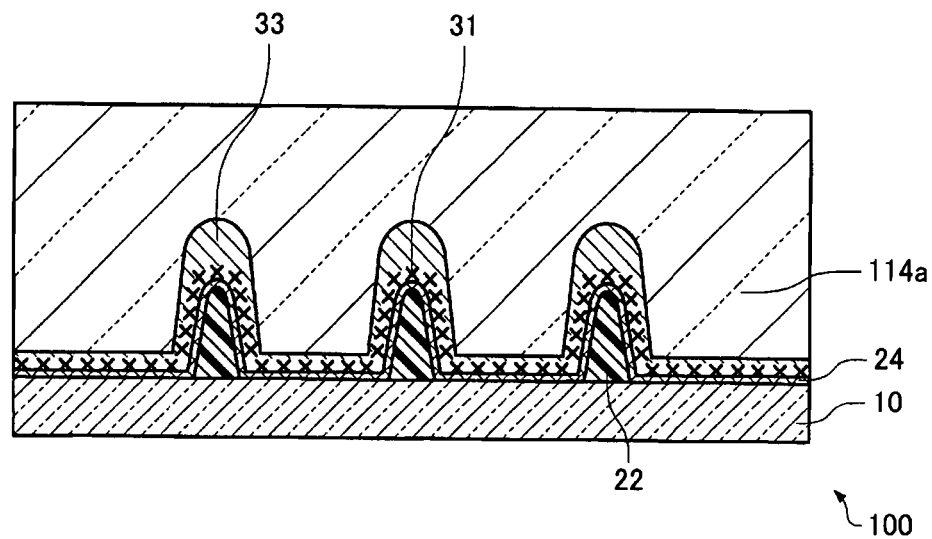
FIG. 13 is a diagram showing a method of manufacturing an element substrate according to one embodiment of the invention.

The metal layer 33 can be formed on the top surface of the catalyst layer 31 on the first support substrate 10 in this manner, as shown in FIG. 12.

The first support substrate 10 may be washed with water after immersion in the electroless plating solution. The first support substrate 10 may be washed with pure water, steam, or pure water and steam. The first support substrate 10 may be dried by heating after washing with water. This improves the adhesion of the metal layer 33 to the first support substrate 10. A plated substrate 100 can be formed by the above steps, as shown in FIG. 12.

The plated substrate 100 is described below. The metal layer 33 of the plated substrate 100 is formed on the top surface and the side surface of the resin section 22. The resin section 22 can function as a core of the metal layer 33. The metal layer 33 may also be formed in the region other than the resin section 22 (i.e., the region other than the predetermined pattern). In the steps for manufacturing the plated substrate 100 described above, the metal layer 33 on the top surface of the resin section 22 can be made thicker than the metal layer 33 in the region other than the predetermined pattern. The reasons therefor are described below.

In the step for manufacturing the plated substrate 100, the metal layer 33 is deposited by immersing the first support substrate 10 in the electroless plating solution 36. The metal layer 33 is formed by an electroless plating reaction. The electroless plating reaction is a reduction reaction between the reducing agent and metal ions in the electroless plating solution, in which the metal ions receive electrons from the reducing agent, whereby plating particles are deposited. Since the reaction is promoted by the catalyst included in the catalyst layer 31, the reaction mainly proceeds near the catalyst layer 31. Since metal ions exist as aggregates in the electroless plating solution, plating particles (i.e., aggregates of metal atoms) are deposited by the reduction reaction. The size of the metal ion aggregates can be controlled by the pH and the temperature of the electroless plating solution, the immersion time, and the like.

In this embodiment, the metal layer 33 can also be deposited in the region other than the resin section 22 (i.e., the region other than the predetermined pattern) since the plating particles in the electroless plating solution 36 are introduced into the region other than the resin section 22. The electroless plating solution 36 located on the top surface of the resin section 22 has a higher fluidity as compared with the electroless plating solution 36 located in the region other than the resin section 22. Thus, the electroless plating solution 36 located near the top surface of the resin section 22 can maintain an almost constant metal ion concentration due to high fluidity, even if metal ions are used for deposition. On the other hand, the metal ion concentration of the electroless plating solution 36 located in the region other than the resin section 22 temporarily decreases after the metal ions are deposited as the metal layer 33, whereby the deposition rate of the metal layer 33 decreases. Therefore, the method of manufacturing the plated substrate 100 according to this embodiment can make the metal layer 33 on the top surface of the resin section 22 thicker than the metal layer 33 provided in the region other than the predetermined pattern.

(6) A sol-gel solution 114a is applied to the top surface of the plated substrate 100. As the coating method, spin coating or the like may be used. As the sol-gel solution 114a, a metal alkoxide such as tetraethoxysilane (TEOS), trimethoxysilane (TMS), or titanium isopropoxide may be used.

(7) The solvent in the sol-gel solution 114a is removed by a heat treatment to obtain an inorganic substrate. A step of obtaining a glass substrate 114 (inorganic substrate) by heating the sol-gel solution 114a including TEOS will be described in detail. The heat treatment is performed in two stages. First, the sol-gel solution 114a is heated to 150° C. (see FIG. 13).

(8) The sol-gel solution 114a is then heated to 400° C. or higher to decompose the release layer 24 and fire the sol-gel solution to obtain the glass substrate 114. The glass substrate 114 includes the metal layer 33, the catalyst layer 31, the release layer 24, and the resin section 22.

Figure 14:
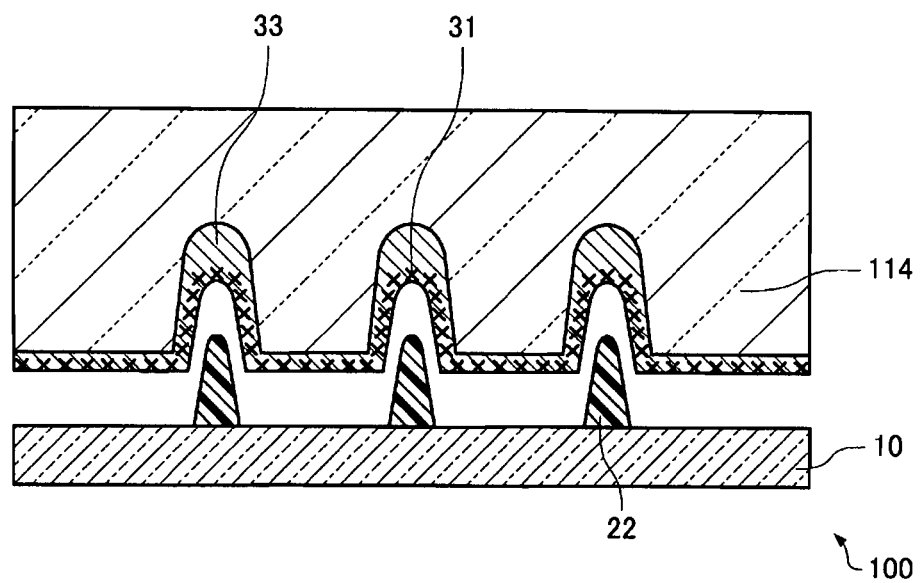
FIG. 14 is a diagram showing a method of manufacturing an element substrate according to one embodiment of the invention.

The metal layer 33 can be removed from the first support substrate 10 by decomposing the release layer 24, as shown in FIG. 14. The resin section 22 can also be removed from the metal layer 33. Thus, a first element substrate 200 having the metal layer 33 with a predetermined pattern on the top surface of the glass substrate 114 can be formed.

The first element substrate 200 is described below. The first element substrate 200 includes the glass substrate 114 and the metal layer 33. The metal layer 33 includes the catalyst layer 31 described above. The glass substrate 114 has holes 202. The planar shape of the hole 202 may be linear, specifically, stripe-shaped. The hole 202 is 40 nanometers to 1.0 micrometer in width and 20 nanometers to 300 nanometers in depth, for example. The hole 202 is provided with the metal layer 33. A recess 204 is formed in the top surface of the metal layer 33. The recess 204 is formed in the upper portion of the hole 202 and is smaller in width and depth than the hole 202, as shown in FIG. 15. The metal layer 33 may also be formed in the region where the hole 202 is not formed. The thickness of the metal layer 33 in the region where the hole 202 is not formed is smaller than that of the metal layer 33 in the region where the hole 202 is formed.

(9) The metal layer 33 may be partially removed by polishing the top surface of the first element substrate 200. The part of the metal layer 33 to be removed is the upper portion of the metal layer 33 (e.g., the metal layer 33 formed outside the hole 202). The metal layer 33 may be polished by chemical mechanical polishing (CMP), for example. A metal layer 34 can be disconnected from the adjacent metal layer 34 by polishing the top surface of the first element substrate 200 in this manner.

The second element substrate 300 can be formed by the above steps (see FIG. 16). The second element substrate 300 includes the glass substrate 114 and the metal layer 34. The metal layer 34 differs from the metal layer 33 described above in that the metal layer 34 is disconnected from the adjacent metal layer 34. Since the metal layer 34 is formed only inside the hole 202 in an embedded state, the adjacent metal layers 34 are prevented from coming in contact with each other when the second element substrate 300 is bent.

The metal layer 34 has a predetermined pattern. The predetermined pattern may be a one-dimensional or two-dimensional periodic pattern, for example. Since the second element substrate 300 has the predetermined pattern on the optically-transparent glass substrate, the second element substrate 300 can function as an optical element substrate such as a polarizer. The second element substrate 300 may have a one-dimensional periodic pattern (striped pattern) in which linear metal layers with a predetermined width are provided repeatedly at uniform intervals. When the width in the periodic direction is equal to or less than the wavelength of visible light and the glass substrate 114 is formed of an optically-transparent substrate, the second element substrate 300 can function as a polarizer.

In the element substrate formed by the manufacturing method described above, the hole 202 may have a width a of 40 nanometers to 1 micrometer and a depth b of 20 nanometers to 300 nanometers. Specifically, the metal layer 34 provided in the hole 202 may have a width of 40 nanometers to 1 micrometer and a depth b of 20 nanometers to 300 nanometers. The recess 204 is formed in the surface of the metal layer 34. The recess 204 is formed in the upper portion of the hole 202 and is smaller in width and depth than the hole 202, as shown in FIG. 16.

2. Electronic Device

Figure 17:
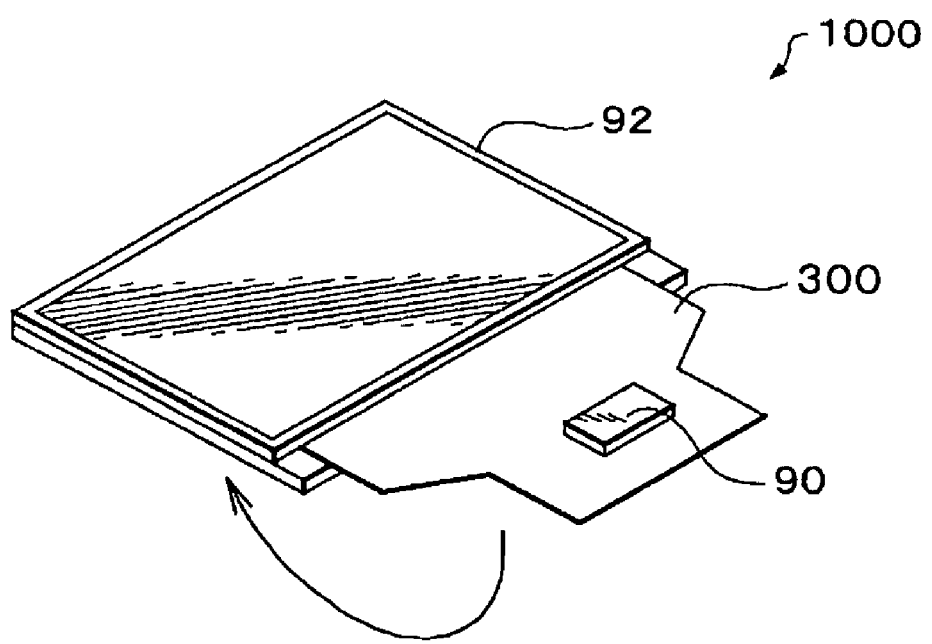
FIG. 17 shows an example of an electronic device to which an element substrate according to one embodiment of the invention is applied.

FIG. 17 shows an example of an electronic device to which the second element substrate manufactured by the method of manufacturing an element substrate according to this embodiment is applied. Since the glass substrate 114 is an insulating substrate, the second element substrate 300 can function as an interconnect substrate. An electronic device 1000 includes the second element substrate 300 as the interconnect substrate, an integrated circuit chip 90, and another substrate 92.

The interconnect pattern formed on the second element substrate 300 may be used to electrically connect electronic parts. The second element substrate 300 is manufactured by the manufacturing method described above. In the example shown in FIG. 17, the integrated circuit chip 90 is electrically connected with the second element substrate 300, and one end of the second element substrate 300 is electrically connected with the other substrate 92 (e.g. display panel). The electronic device 1000 may be a display device such as a liquid crystal display device, a plasma display device, or an electroluminescent (EL) display device.

The second element substrate 300 as an optical element substrate may function as a polarizer for a liquid crystal display device, a projector device, and the like.

The present invention is not limited to the above-described embodiments. Various modifications and variations can be made.

For example, the resin section 22 is formed by reshaping the resin section 22c by immersing the first support substrate 10 in the catalyst adsorption solution 14 in the step (3) described above. However, the first support substrate 10 may be immersed in an alkaline solution before the step (3) (i.e., before immersing the first support substrate 10 in the catalyst adsorption solution 14). Accordingly, the release layer 24 can be formed after forming the resin section 22 with a desired shape, whereby a fine pattern can be formed with higher accuracy.

In the step (5) described above, the metal layer 33 is formed on the resin section 22. Alternatively, the metal layer 33 may be formed in the region where the resin section 22 is not formed. Specifically, the release layer 24 and the catalyst layer 31 are provided in a manner described above after forming the resin section 22c, and the resin section 22c is removed. Accordingly, the catalyst layer 31 is formed only in the region where the resin section 22c is not formed. The first support substrate 10 is then immersed in the electroless plating solution. The metal layer 33 can be formed on the top surface (in the region where the resin section 22 is not formed) of the catalyst layer 31 by the above steps. Since the subsequent steps are the same as those described above, description thereof is omitted.

The invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A method of manufacturing an element substrate comprising:
    (a) forming a release layer on a first support substrate;
    (b) forming a metal layer having a predetermined pattern on the release layer;
    (c) applying a sol-gel solution including a material for an inorganic substrate to the first support substrate;
    (d) removing a solvent from the sol-gel solution by heat treatment to form the inorganic substrate; and
    (e) removing the metal layer from the first support substrate by decomposing the release layer to transfer the metal layer to the inorganic substrate,
    wherein the metal layer is formed by electroless plating in the step (b);
    wherein the first support substrate is immersed in a surfactant solution in the step (a) to form a surfactant layer as the release layer; and
    wherein the step (b) includes:
        forming a catalyst layer on the release layer by immersing the first support substrate in a catalyst solution; and
        depositing a metal layer on the catalyst layer by immersing the first support substrate in an electroless plating solution.

2. The method of manufacturing an element substrate as defined in claim 1, further comprising:
    (f) forming a resin section having the same predetermined pattern as the metal layer has on the first support substrate before the step (a),
    wherein the release layer is formed on the resin section in the step (a).

3. The method of manufacturing an element substrate as defined in claim 2,
    wherein the step (f) includes:
    applying a resin material in a fluid state to the first support substrate;
    pressing a nanostamper having a predetermined recessed pattern against the first support substrate to transfer the predetermined recessed pattern to the resin material; and
    curing the resin material.

4. The method of manufacturing an element substrate as defined in claim 3,
    wherein an upper portion of the cured resin material and a portion of the cured resin material not having the transferred predetermined pattern are removed by ashing between the steps (f) and (a).

5. The method of manufacturing an element substrate as defined in claim 2,
    wherein the resin section is formed of a photoresist; and
    wherein the resin section is formed by an interference exposure method in the step (f).

6. The method of manufacturing an element substrate as defined in claim 2, further comprising:
    removing part of the resin section by immersing the first support substrate in an alkaline solution.

* * * * *

UNITED STATES PATENT AND TRADEMARK OFFICE
Certificate

Patent No. 7,966,720 B2                              Patented: June 28, 2011

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Toshihiko Kaneda, Hakusan (JP).

Signed and Sealed this Tenth Day of April 2012.

<div align="right">

DERRIS H. BANKS
*Supervisory Patent Examiner*
Art Unit 3729
Technology Center 3700

</div>